United States Patent
Natsume (10) Patent No.: US 7,573,968 B2
(45) Date of Patent: Aug. 11, 2009

(54) DATA TRANSMISSION CIRCUIT WITH SERIAL INTERFACE AND METHOD FOR TRANSMITTING SERIAL DATA

(75) Inventor: Kenichi Natsume, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 965 days.

(21) Appl. No.: 10/998,756

(22) Filed: Nov. 30, 2004

(65) Prior Publication Data
US 2006/0115033 A1   Jun. 1, 2006

(51) Int. Cl.
*H04L 25/00* (2006.01)
*H03D 3/24* (2006.01)
*H03L 7/00* (2006.01)

(52) U.S. Cl. .................. 375/371; 375/373; 327/141

(58) Field of Classification Search ............... 375/200, 375/215, 354, 371, 294, 295, 306, 307, 373, 375/376, 377, 220; 370/284, 359, 445, 304, 370/500–520; 365/200
See application file for complete search history.

(56) References Cited

U.S. PATENT DOCUMENTS

| | | | | |
|---|---|---|---|---|
| 5,469,437 A * | 11/1995 | Runaldue | ..................... | 370/445 |
| 5,627,498 A * | 5/1997 | Meyer | ..................... | 331/117 R |
| 5,675,584 A * | 10/1997 | Jeong | ..................... | 370/284 |
| 5,768,546 A * | 6/1998 | Kwon | ..................... | 710/307 |
| 6,346,830 B1 * | 2/2002 | Ishikawa | ..................... | 326/93 |
| 6,424,649 B1 * | 7/2002 | Laor et al. | ..................... | 370/359 |
| 6,614,318 B1 * | 9/2003 | Boecker | ..................... | 331/17 |
| 7,013,128 B2 * | 3/2006 | Ozeki et al. | ..................... | 455/411 |
| 7,260,734 B2 * | 8/2007 | Labate et al. | ..................... | 713/400 |
| 7,280,589 B2 * | 10/2007 | Smith et al. | ..................... | 375/215 |
| 2003/0199262 A1 * | 10/2003 | Chung | ..................... | 455/265 |
| 2004/0130954 A1 * | 7/2004 | Ogawa et al. | ..................... | 365/200 |
| 2004/0252802 A1 * | 12/2004 | Yamaguchi | ..................... | 375/371 |

FOREIGN PATENT DOCUMENTS

| | | |
|---|---|---|
| JP | 07-115362 | 5/1995 |
| JP | 11-317775 | 11/1999 |

* cited by examiner

*Primary Examiner*—Tesfaldet Bocure
*Assistant Examiner*—Lawrence B Williams
(74) *Attorney, Agent, or Firm*—Studebaker & Brackett PC; Donald R. Studebaker (57) ABSTRACT

A data transmission circuit includes a first clock generating circuit that generates a first clock; a second clock generating circuit that generates a second clock, which is different from the first clock; a serial interface circuit that supplies an output signal in synchronization with the first clock; and a latch circuit that latches the output signal, supplied from the serial interface circuit, in synchronization with the second clock, to generate a transmission data to be transmitted.

2 Claims, 8 Drawing Sheets

FIG. 1

—PRIOR ART—

FIG. 2

—PRIOR ART—

FIG. 3

—PRIOR ART—

|  | c0=0, c2=0 | c0=0, c2=1 | c0=1, c2=0 | c0=1, c2=1 |
|---|---|---|---|---|
| c0 | 0 | 0 | 1 | 1 |
| c1 | 0 | 0 | 0 | 0 |
| c2 | 0 | 1 | 0 | 1 |
| c3 | 1 | 1 | 1 | 1 |
| clksel | 3 | 3 | 0 | 0 |

FIG.9

| c0 | c1 | c2 | c3 | clksel |
|---|---|---|---|---|
| 1 | 0 | x | x | 0 |
| x | 1 | 0 | x | 1 |
| x | x | 1 | 0 | 2 |
| 0 | x | x | 1 | 3 |

DATA TRANSMISSION CIRCUIT WITH SERIAL INTERFACE AND METHOD FOR TRANSMITTING SERIAL DATA

TECHNICAL FIELD OF THE INVENTION

The present invention relates to a data-transmission circuit with a serial interface; and more particularly to a data-transmission circuit operating in accordance with well-controlled clock signals.

BACKGROUND OF THE INVENTION

Conventionally, a data transmission circuit formed in a semiconductor integrated circuit includes an oscillator, which supplies a base clock; and a phase-lock-loop circuit, which supplies a clock signal in accordance with the base clock, supplied from the oscillator.

A serial interface circuit is designed to transmit a data in accordance with the clock signal, supplied from the phase-lock-loop circuit. The transmission data is affected by a jitter characteristic of the output signal (clock signal), supplied from the phase-lock-loop circuit. If the jitter characteristic of the clock signal is inferior, a transmitted data would have an inferior jitter characteristic as well. As a result, a receiving error may easily occur and transmission efficiency and quality decreased or deteriorated. Further, product quality of a serial interface circuit (data transmission circuit) is decreased or deteriorated; and therefore, the reliability of products is decreased.

OBJECTS OF THE INVENTION

Accordingly, it is an object of the present invention to provide a data transmission circuit that transmits data with a good jitter characteristic.

It is another object of the present invention to provide a method for transmitting data in that data are transmitted with a good jitter characteristic.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a data transmission circuit includes a first clock generating circuit that generates a first clock; a second clock generating circuit that generates a second clock, which is different from the first clock; a serial interface circuit that supplies an output signal in synchronization with the first clock; and a latch circuit that latches the output signal, supplied from the serial interface circuit, in synchronization with the second clock, to generate a transmission data to be transmitted.

According to a second aspect of the present invention, a method for transmitting data, includes the following steps:

1) generating a first clock a first clock, which is used in a serial interface circuit supplying an output signal and a transmission enable signal;

2) generating a second clock, which is different from the first clock;

3) holding the output signal and transmission enable signal, supplied from the serial interface circuit, in synchronization with the second clock; and 4) transmitting thus held output signal as a transmission data.

According to the present invention, the transmission data is reliably transmitted in synchronization with a clock generated by an oscillator with a small amount of jitter.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
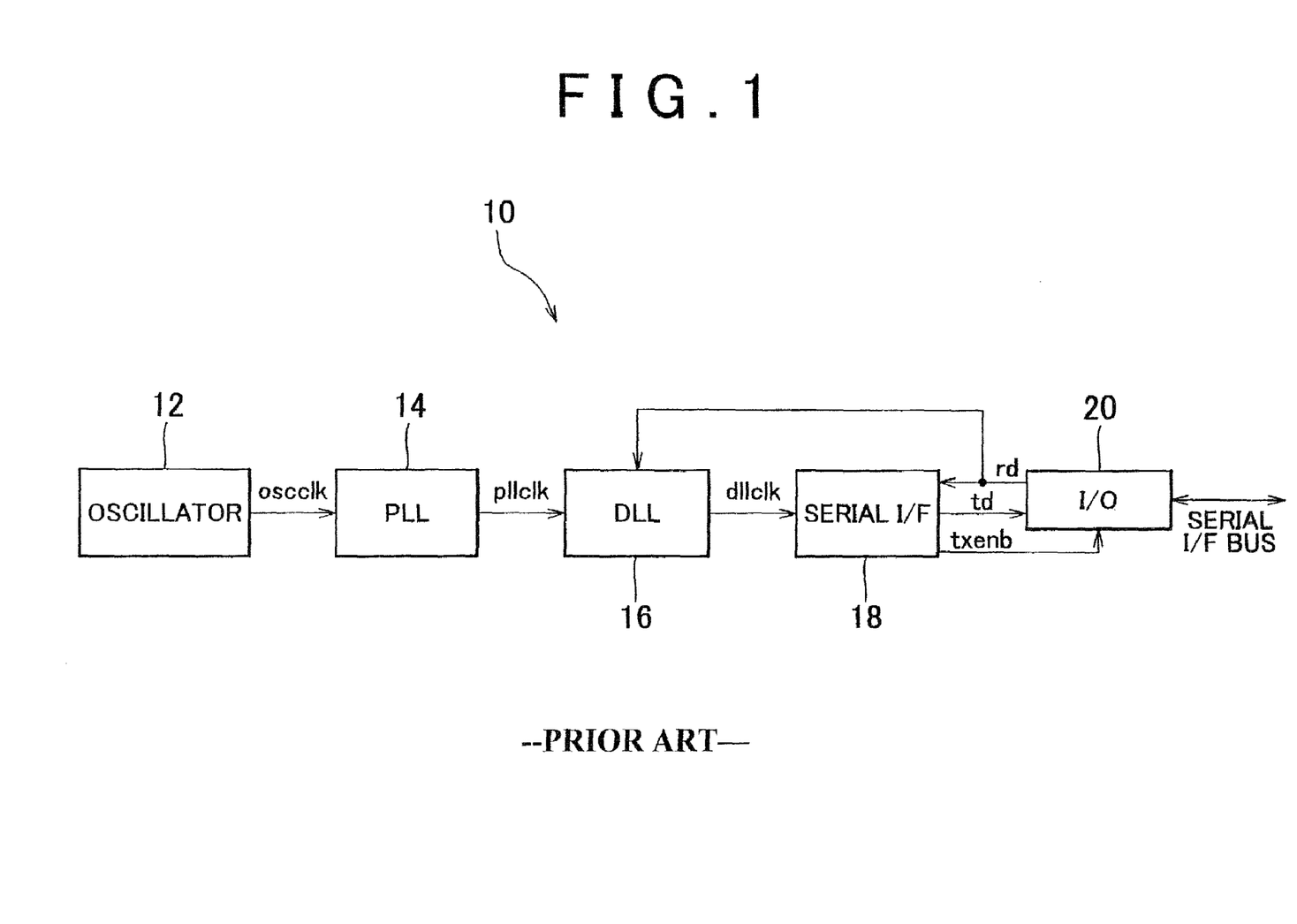
FIG. 1 is a block diagram illustrating a data transmission system related to the present invention.
Figure 2:
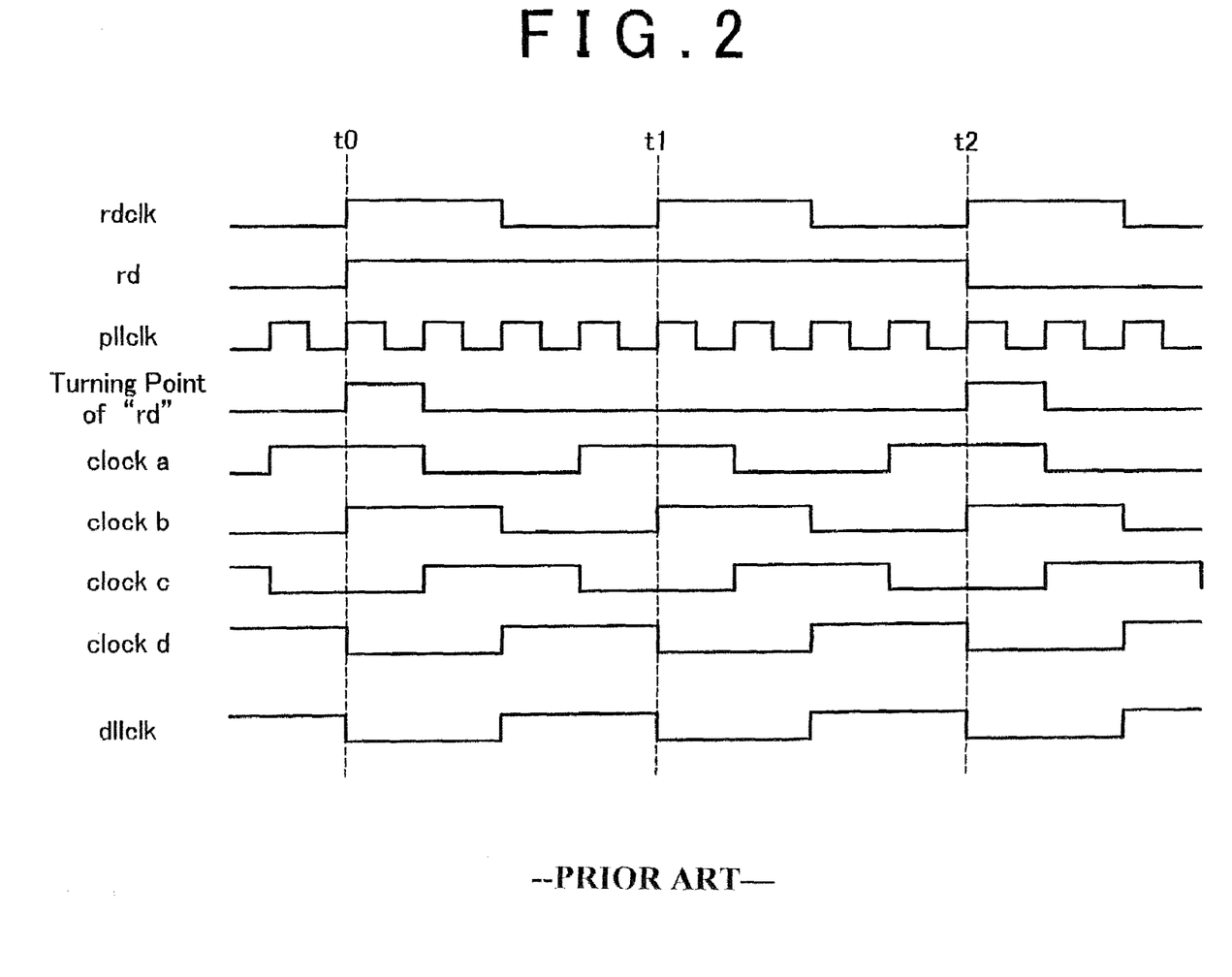
FIG. 2 is a timing chart showing the operation of the data transmission system, shown in FIG. 1.
Figure 3:
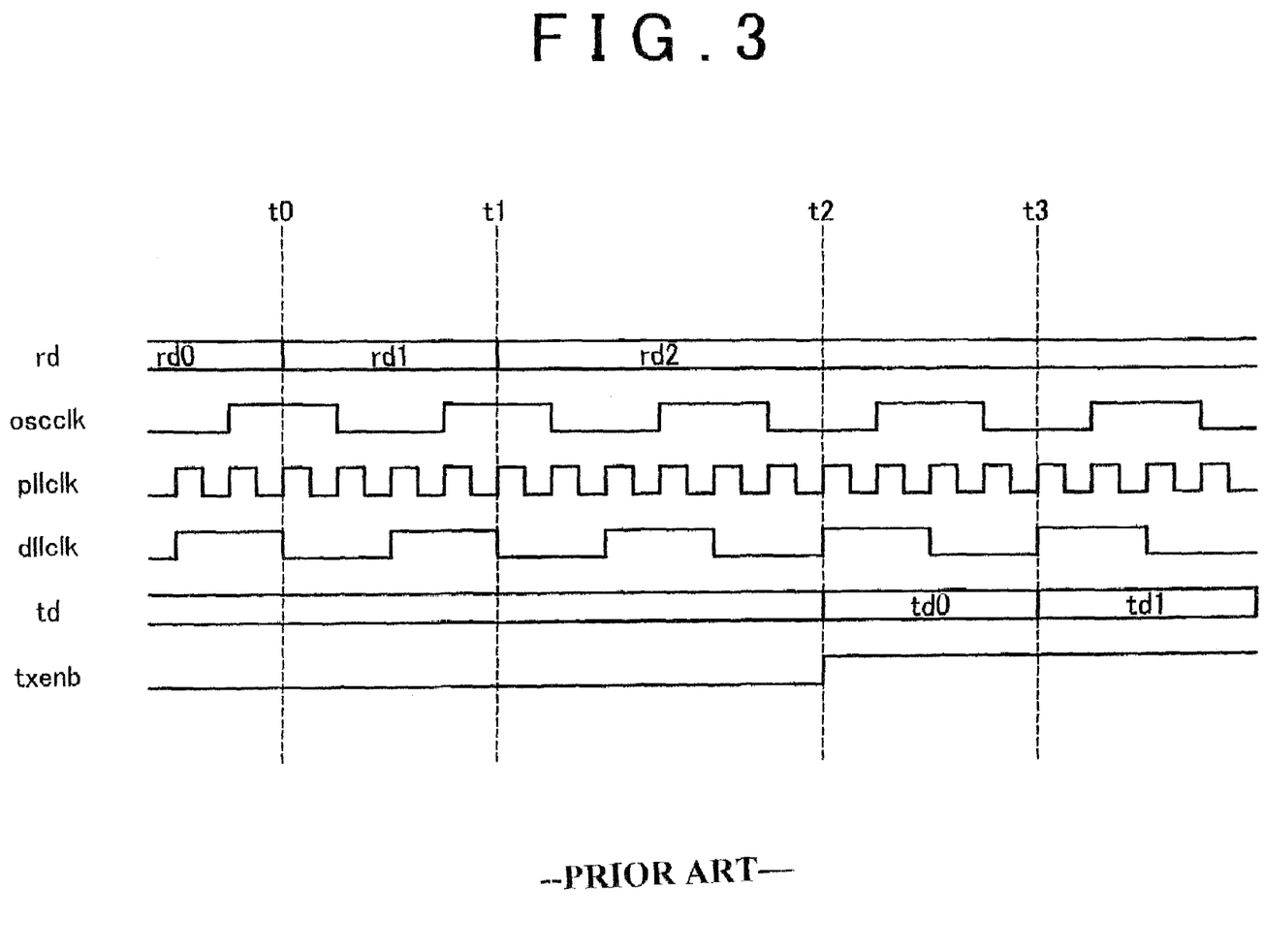
FIG. 3 is a timing chart showing the operation of the data transmission system, shown in FIG. 1.

FIG. 1 is a block diagram illustrating a data transmission system related to the present invention. FIG. 2 is a timing chart showing the operation of the data transmission system, shown in FIG. 1. FIG. 3 is a timing chart showing the operation of the data transmission system, shown in FIG. 1.

A data transmission circuit 10, shown in FIG. 1, includes an oscillator 12, supplying a base clock "oscclk"; a PLL (Phase Locked Loop) circuit 14, supplying a clock signal "pllclk"; a DLL (Delay Locked Loop) circuit 16, supplying a clock signal "dllclk"; a serial interface circuit 18; and a two-way I/O circuit 20. An output terminal of the oscillator is connected to an input terminal of the PLL circuit 14. An output terminal of the PLL circuit 14 is connected to an input terminal of the DLL circuit 16. Another input terminal of the DLL circuit 16 is connected to the two-way I/O circuit 20. An output terminal of the DLL circuit 16 is connected to an input terminal of the serial interface circuit 18. Another input terminal of the serial interface circuit 18 is connected to an output terminal of the two-way I/O circuit 20. Output terminals for transmission data "td" and a transmission enable signal "txenb" of the serial interface circuit 18 are connected to input terminals of the two-way I/O circuit 20. The two-way I/O circuit 20 is connected to a serial interface bus.

The serial interface circuit 18 is connected to the serial interface bus through the two-way I/O circuit 20. The serial interface circuit 18 operates in synchronization with the clock "dllclk" supplied from the DLL circuit 16. The DLL circuit 16 is supplied with received data "rd" from the serial interface circuit 18 and the reference clock "pllclk" from the PLL circuit 14. The PLL circuit 14 generates the reference clock "pllclk" by multiplying the base clock "oscclk", which is generated at the oscillator 12. The clock "pllclk" generated at the PLL circuit 14 is also supplied to other circuits, which are not shown. A high-frequency "pllclk" may be divided and supplied to the DLL circuit 16.

Referring now to FIG. 2, the DLL circuit 16 regenerates appropriate clock "dllclk" for receiving and sampling received data "rd", which are received at the serial interface circuit 18. It is assumed that the received data "rd" changed in level in synchronization with the cycle (period) of a clock "rdclk", as shown in FIG. 2. In this case, the reference clock "pllclk" has a frequency that is four-times as much as the clock "rdclk". The received data "rd" is turned from "0" to "1" at a time t0, and turned from "1" to "0" at a time t2.

As shown in FIG. 2, there can be four clocks "a", "b", "c" and "d", which have the same frequency as the clock "rdclk" and are phase-shifted with a phase-difference corresponding to the period of the reference clock "pllclk". The received data "rd" turns in level in synchronization with a rising edge of the clock "rdclk". The received data "rd" can be reliably sampled in synchronization with a clock that turns at middle between times "t0" and "t1" or "t1" and "t2". Sampling process of the received data "rd" can be carried out precisely at stable points of the data "rd". In the DLL 16, the received data "rd" is sampled in synchronization with the reference clock "pllclk" to detect turning points of the received data "rd". The DLL 16 generates a clock that falls down at the turning points, so that the DLL 16 generates an appropriate clock that rises up in the middle between times "t0" and "t1" or between "t1" and "t2". In other words, as shown in FIG. 2, the DLL 16 generates a clock "d" as the clock "dllclk".

The above described operation of the DLL 16 does not limit the scope of the present invention.

Referring to FIG. 3, the received data "rd" changes to a data "rd1" at a time "t0", and to a data "rd2" at a time "t1". The received data "rd1" and "rd2" are digitals of "0" or "1". As described above, the sampling clock "dllclk" is generated in accordance with the reference clock "pllclk", supplied to the DLL 16, and the received data "rd". After the serial interface circuit 18 completed a receiving process, the serial interface circuit 18 turns from the receiving mode to a transmission mode at a time "t2". At the time "t2", a transmission enable signal "txenb" is turned to "1", and a value "td0" of a transmission data "td" is supplied to the serial interface circuit 18. At a time "t3", the transmission data "td" is tuned to "td1" and is supplied to the serial interface circuit 18.

In FIG. 3, the period of the base clock "oscclk" outputted from the oscillator 12 is used as a reference clock at the PLL circuit 14. The period of the base clock "oscclk" is the same as the received data "rd" and as the clock "dllclk". Other periods can be applied to the base clock "oscclk".

The transmission data "td" is transmitted from the serial interface circuit 18 in synchronization with the clock "dllclk", supplied from the DLL circuit 16.

Figure 4:
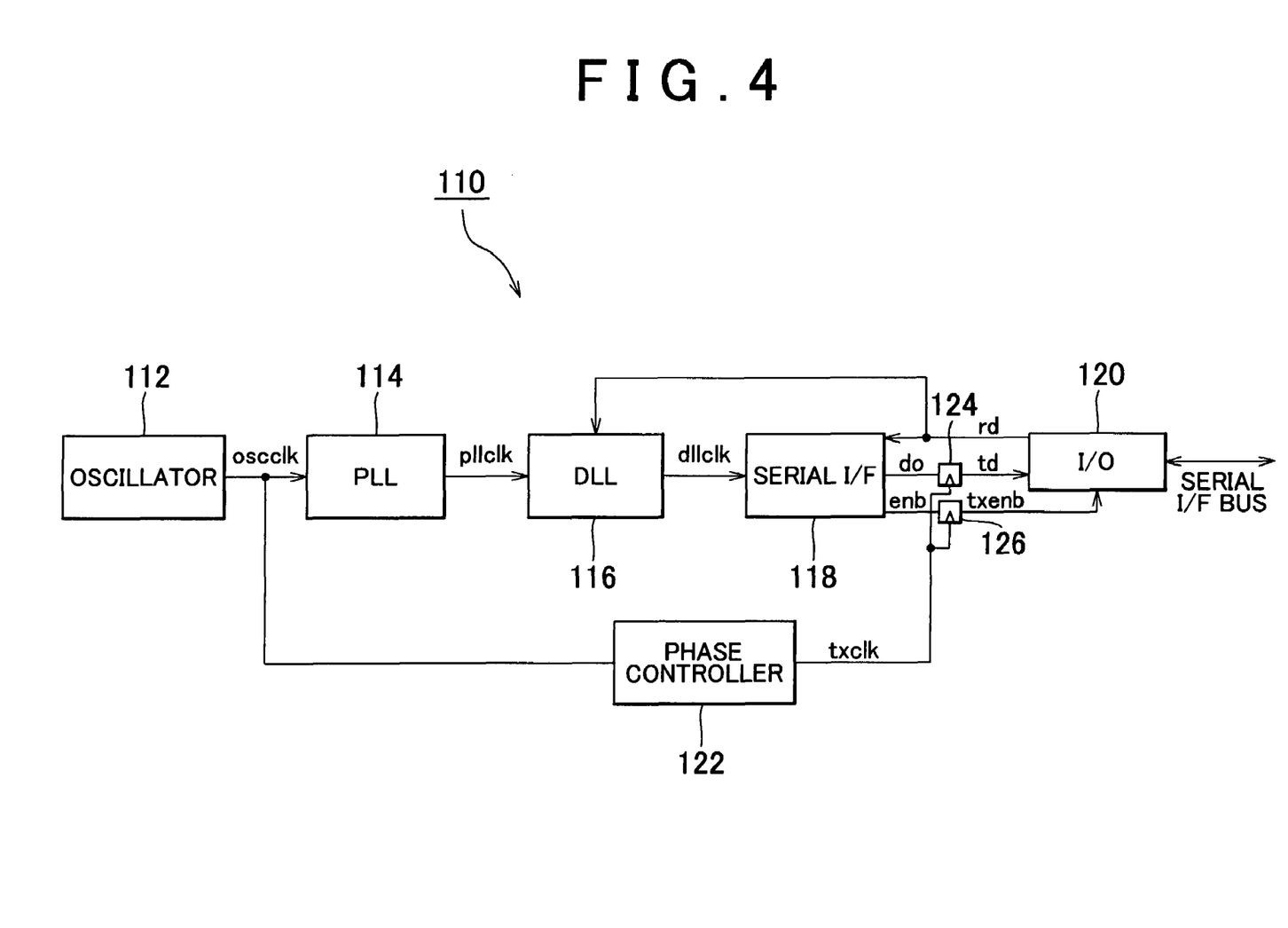
FIG. 4 is a block diagram illustrating a data transmission system according to a first preferred embodiment of the present invention.

FIG. 4 is a block diagram illustrating a data transmission system 110 according to a first preferred embodiment of the present invention. The data transmission system 110 includes a first clock generating circuit (116) that generates a first clock (dllclk); a second clock generating circuit (112, 122) that generates a second clock (tcxlk), which is different from the first clock; a serial interface circuit 118 that supplies an output signal (do) in synchronization with the first clock (dllclk); and a latch circuit that latches the output signal (do), supplied from the serial interface circuit (118), in synchronization with the second clock (tcxlk), to generate a transmission data (td) to be transmitted.

The first clock generating circuit includes a DLL circuit 116. The data transmission system 110 further includes an oscillator 112 that generates a base clock (oscclk), which has the same cycle as a base cycle of the serial interface circuit 118. The second clock generating circuit includes a phase controller 122, which generates the second clock (txclk) in accordance with the base clock (oscclk).

The first clock generating circuit includes a phase lock loop (PLL) circuit 114, which generates a third clock (pllclk) in accordance with the base clock (oscclk). The DLL circuit 116 generates the first clock (dllclk) in accordance with the third clock (pllclk). The serial interface circuit 118 further supplies a transmission enable signal (txenb).

The latch circuit (124, 126) includes a first latch circuit 124 used to hold the output signal (do), supplied from the serial interface circuit 118, and a second latch circuit 126 used to hold the transmission enable signal (txenb), supplied from the serial interface circuit 118.

The data transmission circuit 110, shown in FIG. 4, further includes a two-way I/O circuit 120. An output terminal of the oscillator 112 is connected to an input terminal of the PLL circuit 114. An output terminal of the PLL circuit 114 is connected to an input terminal of the DLL circuit 116. Another output terminal of the oscillator 112 is connected to an input terminal of the phase controller 122. An output terminal of the DLL circuit 116 is connected to an input terminal of the serial interface circuit 118. Another input terminal of the serial interface circuit 118 is connected to an output terminal of the two-way I/O circuit 120. Output terminals for transmission data "td" and a transmission enable signal "txenb" of the serial interface circuit 18 are connected to input terminals of the latch circuits (flip-flop circuits) 124 and 126, respectively.

The two-way I/O circuit 120 is connected to a serial interface bus. An output terminal of the two-way I/O circuit 120 is also connected to an input terminal of the DLL circuit 116. Clock terminals of the latch (flip-flop) circuits 124 and 126 are connected to an output terminal of the phase controller 122. The serial interface circuit 118 is connected to the serial interface bus through the two-way I/O circuit 120. The serial interface circuit 118 operates in synchronization with the clock "dllclk" supplied from the DLL circuit 116. The PLL circuit 114 generates the reference clock "pllclk" by multiplying the base clock "oscclk", which is generated at the oscillator 112. The clock "pllclk" generated at the PLL circuit 114 is also supplied to other circuits, which are not shown. A high-frequency "pllclk" may be divided and supplied to the DLL circuit 116.

The base clock "oscclk" from the oscillator 112 is supplied to the PLL circuit 114 and the phase controller (delay circuit) 122 as a reference clock. A transmission clock "txclk" generated by the phase controller 122 is supplied to the clock terminals of the flip-flop circuits 124 and 126. The phase control circuit 122 includes a delay circuit that controls or adjusts the phase of the base clock "oscclk" to prevent data delivery errors between the serial interface circuit 118 and the flip-flop circuits 124 and 126. In more detail, the phase controller 122 provides a predetermined delay corresponding to a clock delay at the PLL circuit 114 and the DLL circuit 116 in order to secure a data transmission time that is more than one clock of the reference clock "pllclk" between the serial interface circuit 118 and the flip-flop circuits 124 and 126.

Output data "do" and a transmission enable signal "enb", outputted from the serial interface circuit 118, are supplied to data input terminals of the flip-flop circuits 124 and 126, respectively. Output signals of the flip-flop circuits 124 and 126 are supplied to the two-way I/O circuit 120 as the transmission data "td" and transmission enable signal "txenb", respectively. Received data "rd" are supplied from the two-way I/O circuit 120 to the serial interface circuit 118 and the DLL circuit 116.

When the transmission enable signal "txenb" is "1", the two-way I/O circuit 120 transfers a transmission data "td" to the serial interface bus. On the other hand, when the transmission enable signal "txenb" is "0", the two-way I/O circuit 120 transfers a received data "rd" to the serial interface circuit 118 and the DLL circuit 116. The DLL circuit 116 performs sampling process to the received data "rd" in accordance with the clock "pllclk" to generate the clock "dllclk". The serial interface circuit 118 performs sampling process to the received data "rd" in accordance with the clock "dllclk", supplied from the DLL circuit 116.

Figure 5:
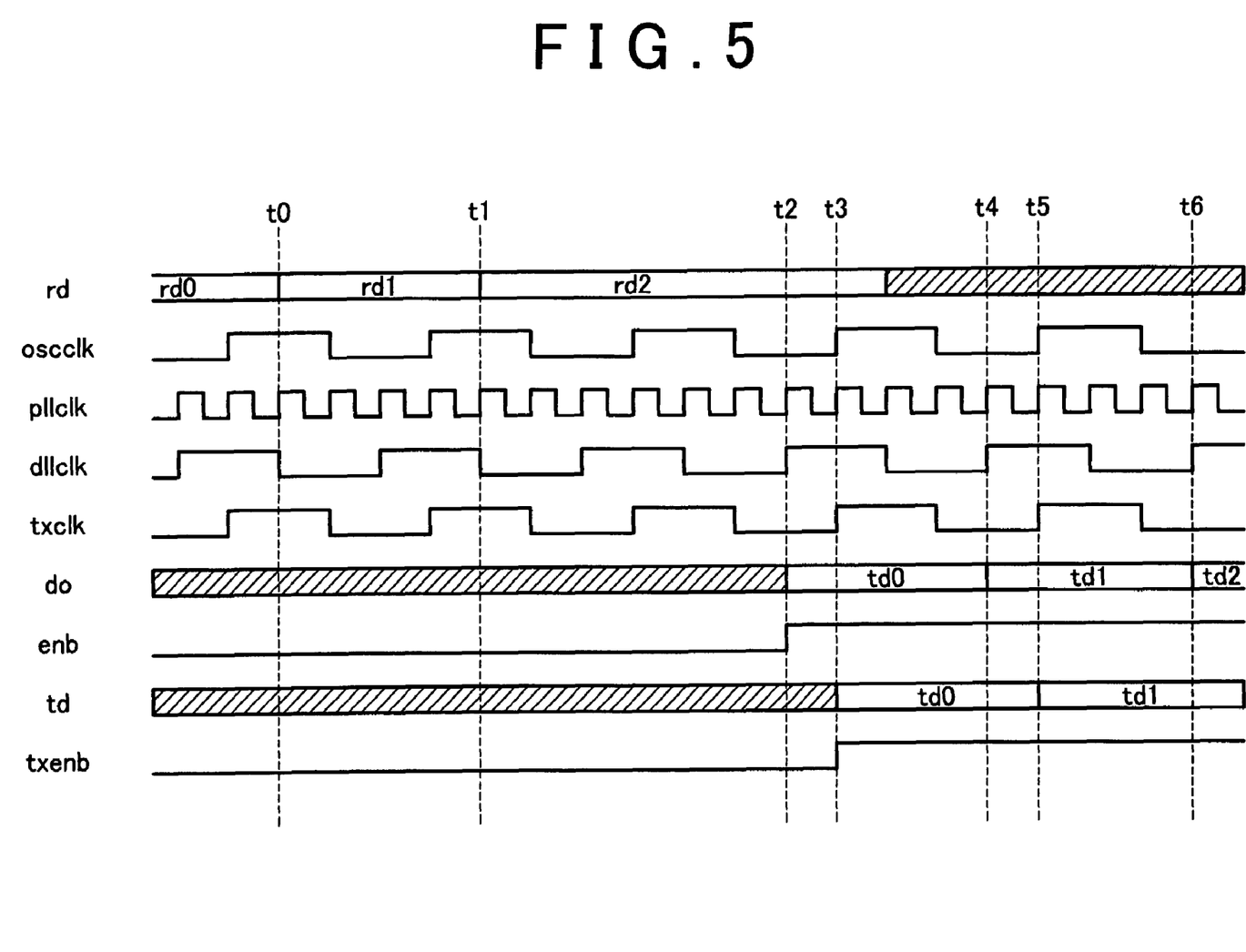
FIG. 5 is a timing chart showing the operation of the data transmission system, shown in FIG. 4.

FIG. 5 is a timing chart showing the operation of the data transmission system 110, shown in FIG. 4. The received data "rd" is turned to "rd1" and "rd2" at times t0 and t1, respectively. The DLL circuit 116 outputs the clock "dllclk" when the data are changed in level. In the timing chart of FIG. 5, for easier understanding, delay at the PLL circuit 114 and the DLL circuit 116 is determined to be small, so that the base clock "oscclk", which is an output of the oscillator 112, seems to have a similar waveform to the transmission clock "txclk".

The serial interface circuit 118 is turned from receiving mode to transmitting mode at the time t2. The serial interface circuit 118 outputs a signal "td0" as the transmission data "do", since the transmission enable signal "txenb" turns to "1". At a time t3, the transmission clock "txclk" rises up, the flip-flop circuit 124 holds or latches the transmission data "td0", and the flip-flop circuit 126 holds or latches the transmission enable signal "enb(=1)". The transmission enable signal "txenb" is turned to "1", and the two-way I/O circuit 120 outputs the signal "td0" to the serial interface bus in an output mode. Data "td1" outputted from the serial interface circuit 118 at a time t4 are transferred to the serial interface bus. After that, the same operation is repeated until transmission process is completed.

As described above, according to the first preferred embodiment, the transmission data "td" can be transmitted in synchronization with a base clock, outputted from an oscillator; and therefore, the data can be reliably transmitted with a jitter characteristic of the oscillator.

Figure 6:
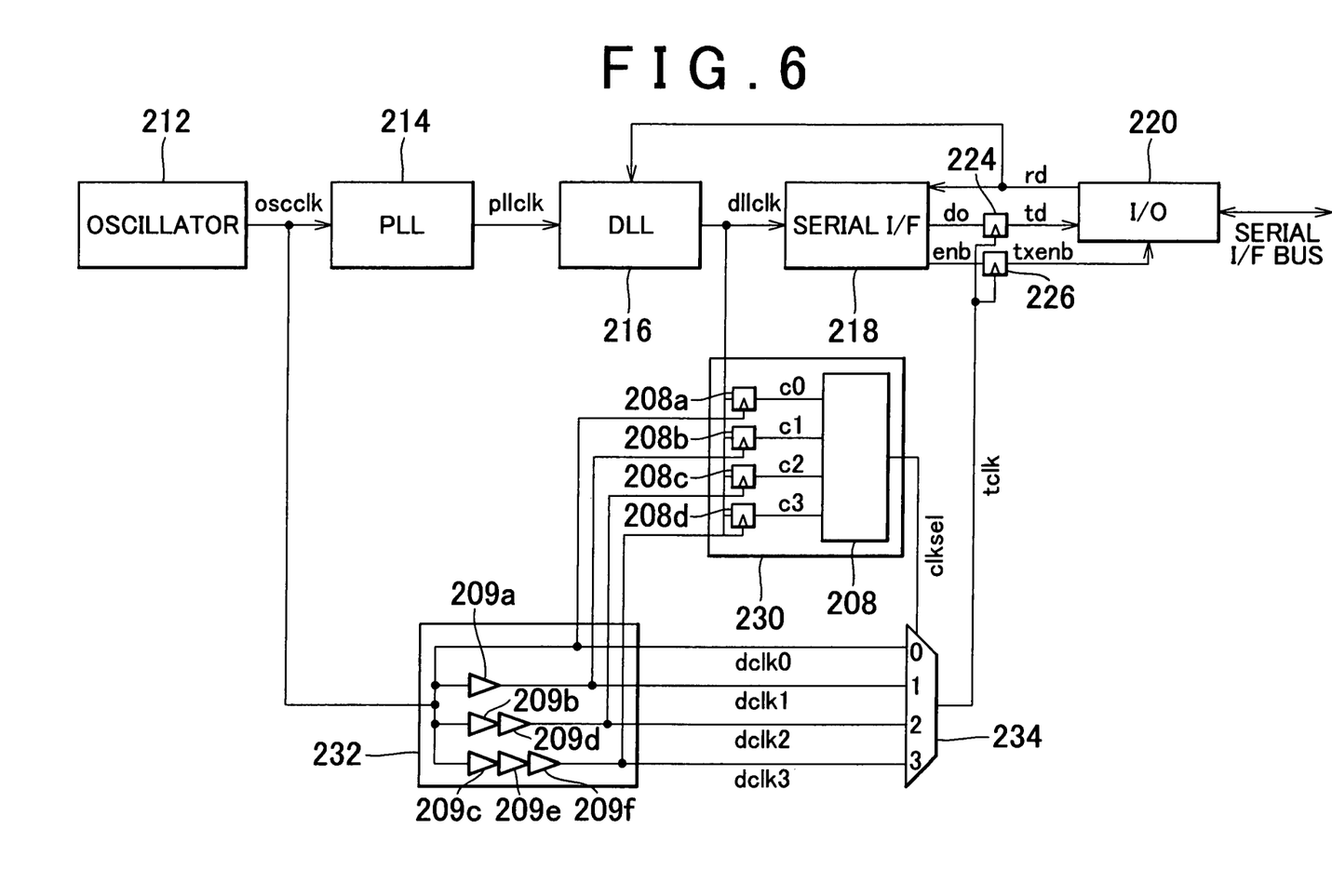
FIG. 6 is a block diagram illustrating a data transmission system according to a second preferred embodiment of the present invention.

FIG. 6 is a block diagram illustrating a data transmission system according to a second preferred embodiment of the present invention. The data transmission system includes a first clock generating circuit (216) that generates a first clock (dllclk); a second clock generating circuit (112, 122) that generates a second clock (tcxlk), which is different from the first clock; a serial interface circuit 218 that supplies an output signal (do) in synchronization with the first clock (dllclk); and a latch circuit (224, 226) that holds or latches the output signal (do), supplied from the serial interface circuit 118, in synchronization with the second clock (tcxlk), to generate a transmission data (td) to be transmitted.

The first clock generating circuit includes a DLL circuit 216. The data transmission system further includes an oscillator 212 that generates a base clock (oscclk). The first clock generating circuit includes a phase lock loop (PLL) circuit 214, which generates a third clock (pllclk) in accordance with the base clock (oscclk). The DLL circuit 216 generates the first clock (dllclk) in accordance with the third clock (pllclk). The serial interface circuit 218 further supplies a transmission enable signal (txenb).

The second clock generating circuit includes a possible clock generating circuit (230, 232), that generates a plurality of possible clock signals (dclk0-dclk3) having a predetermined cycle corresponding to the first clock (dllclk); and a clock selecting circuit 234, which selectively supplies one from the possible clock signals (dclk0-dclk3) to the latch circuit (224, 226) as the second clock (tclk). The possible clock signals (dclk0-dclk3) are phase-shifted from each other.

The second clock generating circuit further includes a detecting circuit 230 that detects a condition of the first clock (dllclk) and generates a selecting signal (clksel), which is to be used for selecting the possible clock signals (dclk0-dclk3) at the clock selecting circuit 234. The clock selecting circuit 234 selectively outputs one from the possible clock signals dclk0-dclk3 in accordance with the selecting signal "clksel". In more detail, the possible clock signals dclk0-dclk3 are selected when the selecting signal "clksel" is "0", "1", "2" and "3", respectively. The possible clock generating circuit 232 includes a delay circuit, which is supplied with the base clock (oscclk).

The latch circuit (224, 226) includes a first latch (flip-flop) circuit 224 used to hold the output signal (do), supplied from the serial interface circuit 218, and a second latch (flip-flop) circuit 226 used to hold the transmission enable signal (txenb), supplied from the serial interface circuit 218. The data transmission system, shown in FIG. 6, further includes a two-way I/O circuit 220.

An output terminal of the oscillator 212 is connected to an input terminal of the PLL circuit 214. An output terminal of the PLL circuit 214 is connected to an input terminal of the DLL circuit 216. Another output terminal of the oscillator 212 is connected to an input terminal of the possible clock (delayed clock) generating circuit 232. An output terminal of the possible clock generating circuit 232 is connected to an input terminal of the detecting circuit 230 and the clock selecting circuit 234. An output terminal of the detecting circuit 230 is connected to a control terminal of the clock selecting circuit 234. An output terminal of the clock selecting circuit 234 is connected to clock terminals of the flip-flop circuits 224 and 226.

An output terminal of the DLL circuit 216 is connected to an input terminal of the serial interface circuit 218. Another input terminal of the serial interface circuit 218 is connected to an output terminal of the two-way I/O circuit 220. Output terminals for transmission data "td" and a transmission enable signal "txenb" of the serial interface circuit 218 are connected to input terminals of the latch circuits (flip-flop circuits) 224 and 226, respectively.

The two-way I/O circuit 220 is connected to a serial interface bus. An output terminal of the two-way I/O circuit 220 is also connected to an input terminal of the DLL circuit 216. The serial interface circuit 218 is connected to the serial interface bus through the two-way I/O circuit 220. The serial interface circuit 218 operates in synchronization with the clock "dllclk" supplied from the DLL circuit 216. The PLL circuit 214 generates the reference clock "pllclk" by multiplying the base clock "oscclk", which is generated at the oscillator 212. The clock "pllclk" generated at the PLL circuit 214 is also supplied to other circuits, which are not shown. A high-frequency "pllclk" may be divided and supplied to the DLL circuit 216.

The detecting circuit 230 includes a selecting signal generating circuit 208 and flip-flop circuits 208a-208d. The selecting signal generating circuit 208 is a decode circuit, which generates a selecting signal "clksel" in accordance with values at input terminals c0-c3. Data input terminals of the flip-flop circuits 208a-208d are supplied with the clock "dllclk", outputted from the DLL circuit 216. Clock input terminals of the flip-flop circuits 208a-208d are supplied with delayed clocks "dclk0"-"dclk3", which are outputted from the delay clock generating circuit 232. Output terminals of the flip-flop circuits 208a-208d are connected to input terminals of the selecting signal generating circuit 208. An output terminal of the selecting signal generating circuit 208 is connected to the control terminal of the clock selecting circuit 234.

The delay clock generating circuit 232 includes delay circuits 209a-209f to generate the delayed clocks "dclk0"-"dclk3", which are supplied to input terminals 0-3 of the clock selecting circuit 234. Each of the delay circuits 209a-209f provides a delay time, which corresponds to a cycle or period of the clock "pllclk", supplied from the PLL circuit 214.

The base clock "oscclk" from the oscillator 212 is supplied to the PLL circuit 214 and the delay clock generating circuit 232 as a reference clock. Delayed clocks "dclk0"-"dclk3" are supplied to the clock terminals of the flip-flop circuits 208a-208d in the detecting circuit 230 and to the clock selecting circuits 234.

Output data "do" and a transmission enable signal "enb", outputted from the serial interface circuit 218, are supplied to data input terminals of the flip-flop circuits 224 and 226, respectively. Output signals of the flip-flop circuits 224 and 226 are supplied to the two-way I/O circuit 220 as the transmission data "td" and transmission enable signal "txenb", respectively. Received data "rd" are supplied from the two-way I/O circuit 220 to the serial interface circuit 218 and the DLL circuit 216.

The oscillator 212 generates the base clock "oscclk" that has the same cycle as a base cycle of the serial interface. When the transmission enable signal "txenb" is "1", the two-way I/O circuit 220 transfers a transmission data "td" to the serial interface bus. On the other hand, when the transmission enable signal "txenb" is "0", the two-way I/O circuit 220 transfers a received data "rd" to the serial interface circuit 218 and the DLL circuit 216. The DLL circuit 216 performs sampling process to the received data "rd" in accordance with the clock "pllclk" to generate the clock "dllclk". The serial interface circuit 218 performs sampling process to the received data "rd" in accordance with the clock "dllclk", supplied from the DLL circuit 216.

Figure 7:
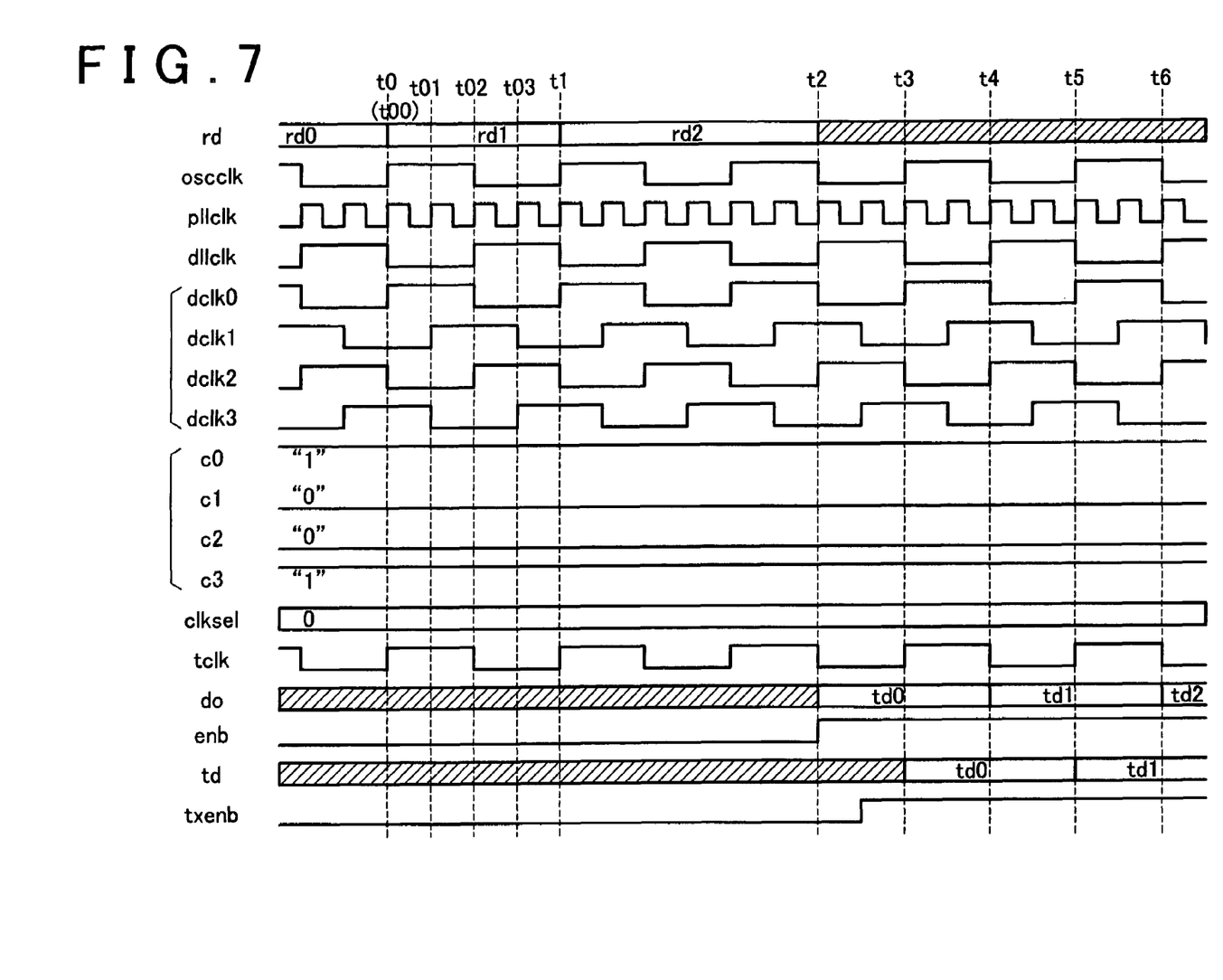
FIG. 7 is a timing chart showing the operation of the data transmission system, shown in FIG. 6.

FIG. 7 is a timing chart showing the operation of the data transmission system, shown in FIG. 6. The serial interface circuit 218 is in a receiving mode until a time "t2". The DLL circuit 216 outputs the clock "dllclk" when the received data "rd" are changed in level at times t0 and t1. Since each of the delay circuits 209a-209f provides a delay time, which corresponds to a cycle or period of the clock "pllclk", supplied from the PLL circuit 214, the delayed clocks "dclk0"-"dclk3" are phase-shifted each other by a period corresponding to the clock "pllclk", which is outputted from the PLL circuit 214.

The flip-flop circuits 208a-208d in the detecting circuit 230 hold or latch the clock "dllclk" at timings in which the delayed clocks dclk0-dclk3 rise up (turn to high levels). At a time "t00 (=t0), the delayed clock "dclk0" turns to low and the clock "dllclk" turns to high, so that the flip-flop circuit 208a outputs "c0" in level "1" or "0". In the case shown in FIG. 7, the flip-flop circuit 208a outputs "c0" in level "1". At a time "t01, the delayed clock "dclk1" turns to low and the clock "dllclk" is in level "0", so that the flip-flop circuit 208b outputs "c1" in level "0". At a time "t02, the delayed clock "dclk2" turns to high and the clock "dllclk" turns to high, so that the flip-flop circuit 208c outputs "c2" in level "0" or "1". In the case shown in FIG. 7, the flip-flop circuit 208c outputs "c2" in level "0". At a time "t03, the delayed clock "dclk3" turns to high and the clock "dllclk" is in level "1", so that the flip-flop circuit 208d outputs "c3" in level "1".

Figure 8:
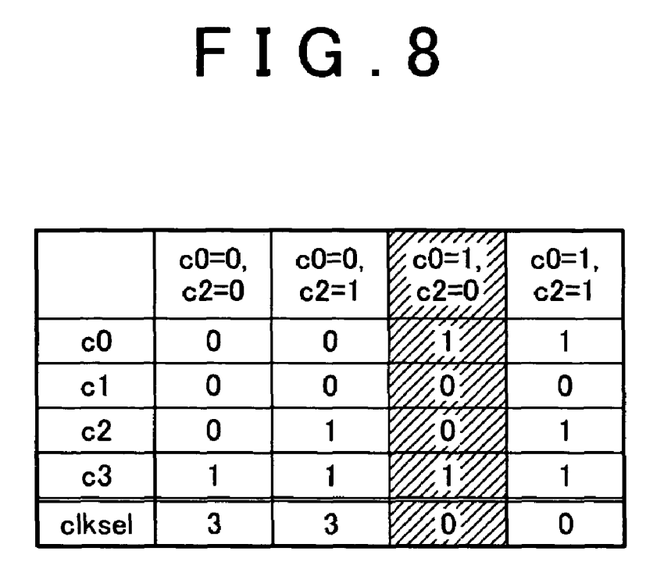
FIGS. 8 and 9 are tables used for describing the operation of the data transmission system, shown in FIG. 6.
Figure 9:
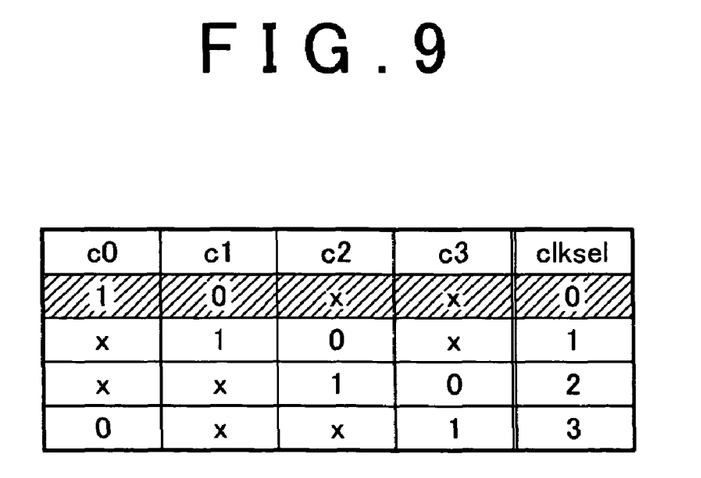

A table in FIG. 8 shows every possible pattern or combination in that the signals c0-c3 take. Each of the signal c0-c3 represents whether the clock "dllclk" is in level "1" or "0". It is assumed that the value is checked in the order of "c0-c1-c2 and c3", the clock "dllclk" turns to low when the value changes "1" to "0". According to the combination shown in FIG. 7, in which "c0=1" and "c1=0", the clock "dllclk" is turned to low in a timing between a rising point of "dclk0" and a rising point of "dclk1". In this case "rising point" may mean a point at which the level of a signal turns to high. As shown in FIG. 9, the selecting signal "clksel" becomes "0" in level. The clock selecting circuit 234 selects the delayed clock "dclk0" as the transmission clock "tclk". The detecting circuit 230 outputs a clock selecting signal "clksel" that is used to select one from the delayed clocks "dclk0"-"dclk3", which turns to high when the clock "dllclk" turns to low, according to the phase difference between the base clock "oscclk" and the clock "dllclk".

The serial interface circuit 218 is turned from receiving mode to transmitting mode at a time t2. The serial interface circuit 218 outputs a signal "td0" as the transmission data "do", since the transmission enable signal "enb" becomes "1". At a time t3, the transmission clock "txclk" rises up, the flip-flop circuit 224 holds or latches the transmission data "td0", and the flip-flop circuit 226 holds or latches the transmission enable signal "enb(=1)". The transmission enable signal "txenb" is turned to "1", and the two-way I/O circuit 220 outputs the signal "td0" to the serial interface bus in an output mode. Data "td1" outputted from the serial interface circuit 218 at a time t4 are transferred to the serial interface bus. After that, the same operation is repeated until transmission process is completed.

As described above, according to the second preferred embodiment, the transmission data "td" can be transmitted in synchronization with a base clock, outputted from an oscillator; and therefore, the data can be reliably transmitted with a jitter characteristic of the oscillator. As compared to the first preferred embodiment, it is unnecessary to consider clock delay at a PLL circuit and at a DLL circuit, so that control of clock timing is easily carried out.

What is claimed is:

1. A data transmission circuit, comprising:
 a first clock generating circuit that generates a first clock;
 a second clock generating circuit that generates a second clock, which is different from the first clock;
 a serial interface circuit that supplies an output signal in synchronization with the first clock; and
 a latch circuit that latches the output signal, supplied from the serial interface circuit, in synchronization with the second clock, to generate a transmission data to be transmitted,
 wherein the second clock generating circuit comprises:
 1) a clock generating circuit, that generates a plurality of clock signals having a predetermined cycle corresponding to the first clock; and
 2) a clock selecting circuit, which selectively supplies one from the plurality of clock signals to the latch circuit as the second clock, wherein the plurality of clock signals are phase-shifted from each other, and wherein the second clock generating circuit further comprises a detecting circuit that detects a condition of the first clock and generates a selecting signal, which is to be used for selecting one of the plurality of clock signals at the clock selecting circuit.

2. A method for transmitting data, comprising:

generating a first clock, which is used in a serial interface circuit supplying an output signal and a transmission enable signal;

generating a second clock, which is different from the first clock;

holding the output signal and transmission enable signal, supplied from the serial interface circuit, in synchronization with the second clock;

transmitting the held output signal as a transmission data;

generating a plurality of clock signals having a predetermined cycle corresponding to the first clock;

selectively supplying one from the plurality of clock signals as the second clock, wherein the plurality of clock signals are phase-shifted from each other; and detecting a condition of the first clock and generating a selecting signal, which is to be used for selecting one of the plurality of clock signals.

* * * * *